United States Patent [19]
Robbie et al.

[11] Patent Number: 5,866,204
[45] Date of Patent: Feb. 2, 1999

[54] METHOD OF DEPOSITING SHADOW SCULPTED THIN FILMS

[75] Inventors: Kevin John Robbie; Michael Julian Brett, both of Edmonton, Canada

[73] Assignees: The Governors of the University of Alberta; Alberta Microelectronic Corporation, both of Edmonton, Canada

[21] Appl. No.: 681,434

[22] Filed: Jul. 23, 1996

[51] Int. Cl.[6] .................................................. B05D 5/00
[52] U.S. Cl. .................... 427/256; 427/248.1; 427/255.5
[58] Field of Search ........................... 427/248.1, 255.5, 427/256

[56] References Cited

U.S. PATENT DOCUMENTS

| | | | |
|---|---|---|---|
| 4,816,946 | 3/1989 | Kira et al. ................................ | 360/110 |
| 4,874,664 | 10/1989 | Hamaguchi et al. .................... | 428/325 |
| 4,947,046 | 8/1990 | Kawabata et al. ..................... | 250/484.1 |
| 5,226,383 | 7/1993 | Bhat ........................................ | 118/730 |

FOREIGN PATENT DOCUMENTS

| | | | |
|---|---|---|---|
| 0517411A1 | 5/1992 | European Pat. Off. .......... | G11B 5/64 |

OTHER PUBLICATIONS

Tailoring growth and local composition by oblique–incidence deposition: a review and new experimental data, Herma van Kranenburg and Cock Lodder, Materials Science and Engineering R11, No. 7, Jan. 15, 1994, pp. 295–354.

Chiral thin solid films: Method of deposition and applications, R.M.A. Azzam, Appl. Phys. Lett. 61(26), 28 Dec. 1992, pp. 3118–3120.

Sculptured Thin Films (STFs) for Optical, Chemical and Biological Applications, A. Lakhtakia, R. Messier, M.J. Brett and K. Robbie, Innovations in Materials Research, vol. 1, No. 2, pp. 167–176, Jul., 1996.

Chiral sculptured thin films, K. Robbie, J.M. Brett, Nature, vol. 384 . 19/26 Dec., 1996, 1 page.

Project Summary for Grant Proposal 960048 of Reveo, Inc., found on the internet on Jan. 4, 1997, actual publication date not known, one page.

Project Summary for Grant Proposal 960049 of Reveo, Inc., found on the internet on Jan. 4, 1997, actual publication date not known, one page.

Technical Abstract of Reveo Inc. relating to topic No. BMDO96–011, title: "High performance circular polarizers for space applications" found on the internet on Jan. 4, 1997, actual publication date not known, one page.

Technical abstract of Reveo, Inc., relating to topic No. BMDO96–011, title: "Novel Chiral Film Technology for Ultrahigh–Capacity and Ultrafast–Retrieval Optical Storage", found on the internet on Jan. 4, 1997, actual publication date not known, one page.

Technical abstract of Reveo, Inc., title: "Novel Superbroadband Reflective Polarizer", available on the internet in Jan. 1997, from the site http://www.spie.org/web/abstracts/2800/2873.html, together with material on awards from site http://www.sbaonline.sba.gov, also available on the internet in Jan. 1997, publication dates not known.

Optically Active Fluorite Films, Niels O. Young, Jakym Kowal, Nature, Jan. 10, 1959, vol. 183, No. 4654, pp. 104 and 105.

(List continued on next page.)

*Primary Examiner*—Roy V. King
*Attorney, Agent, or Firm*—Anthony R. Lambert

[57] ABSTRACT

A method of making vapor deposited thin films by rotating a substrate in the presence of an obliquely incident vapor flux. The substrate may be rotated about an axis normal to the surface of the substrate and/or parallel to the surface of the substrate by two motors mounted with their axes orthogonal to each other. Angle of incidence, measured from the normal to the surface of the substrate, exceeds 80°. Feedback from a deposition rate monitor allows control of rotation speed of both motors to produce a growth with a defined pattern.

17 Claims, 10 Drawing Sheets

OTHER PUBLICATIONS

Sculptured thin films and glancing angle deposition: Growth mechanics and applications, K. Robbie and M.J. Brett, J. Vac. Sci. Technol. A 15(3), May/Jun. 1997, pp. 1460–1466.

Sculptured Thin Films (STFs) for Optical, Chemical and Biological Applications, A. Lakhtakia, R. Messier, M.J. Brett and K. Robbie, Innovations in Materials Research, vol. 1, No. 2, pp. 165–176, Jul., 1996.

Inhomogeneous thin films optical filters fabricated using glancing angle deposition, K. Robbie, A.J.P. Hnatiw, M.J. Brett, R.I. MacDonald and J.N. McMullin, Electronics Letters, 3rd Jul. 1997, vol. 33 No. 14, pp. 1213–1214.

Abstract of U.S. Patent 5,179,469, Jan. 12, 1993, 2 pages.

Modelling and characterization of columnar growth in evaporated films, R.N. Tait, T. Smy and M.J. Brett, Thin Solid Films, 226 (1993) pp. 196–201.

Abstract of Japanese Patent No. 03134819, Jul. 6, 1991, translated, 1 page.

Robbie et al, Fabrication of Thin Films with highly porous microstructure, J. Vac. Sci.Technol. A 13(3), May/Jun. 1995, pp. 1032–1035.

Tang et al, Patterns and Scaling Properties in a Ballistic Deposition Model, Physical Review Letters, vo. 71, No. 17, 25 Oct. 1993, pp. 2769–2772.

Messier et al, J. Vac. Sci. Technol, A, 15(4) 1997 pp. 2148–2152.

First thin film realization of a helicoidal bianisotropic medium, Kevin Robbie and Michael J. Brett, Akhlesh Lakhtakia, J. Vac. Sci. Technol. A 18 (6), Nov/Dec 1995, pp. 2991–2993. The subject matter of this paper was also disclosed at a meeting at Pennsylvania State university, U.S.A., in Aug. 1995.

Fabrication of thin films with highly porous microstructures, K. Robbie, L.J. Friedrich, and S.K. Dew, T. Smy, M.J. Brett, J. Vac. Sci. Technol. A 13(3), T. Smy, M.J. Brett, J. Vac. Technol. A 13(3), May/Jun. 1995, pp. 1032–1035. The subject matter of this paper was also disclosed at a conference in Denver, U.S.A. in Oct., 1994.

Applications of Interemetallic Compounds, MRS Bulletin, May 1996, vol. 21, No. 5, pp. 7 and 8.

Thin–Film Deposition, Principles and Practice, Donald L. Smith, 1995, pp. 94–98.

Abstract of U.S. Ptent 5,474,611, Dec. 12, 1995, 2 pages.

Abstract of U.S. Patent 5,226,383, Jul. 13, 1993, 2 pages.

Abstract of U.S. Patent 4,794,220, Dec. 27, 1998, 2 pages.

METHOD OF DEPOSITING SHADOW SCULPTED THIN FILMS

FIELD OF THE INVENTION

This invention relates to the deposition of shadow sculpted thin films on substrates.

CLAIM TO COPYRIGHT

A portion of the disclosure of this patent document contains material which is subject to copyright protection. The copyright owner has no objection to the facsimile reproduction by anyone of the patent document, as it appears in the Patent and Trademark Office patent file or records, but otherwise reserves all copyright rights whatsoever.

REFERENCE TO MICROFICHE APPENDIX

A microfiche appendix containing software for implementing aspects of the method of the invention disclosed herein forms part of this patent document. The microfiche is on one sheet, and has 27 frames.

BACKGROUND OF THE INVENTION

In the art of growing thin films, it is known to expose a substrate to an oblique incident vapor flux in conditions of limited adatom diffusion and thus grow a columnar microstructure on the substrate.

The optical properties of the resulting microstructure are dependent in part on the material used, the porosity of the microstructure and the orientation of the columns of the thin film.

Hamaguchi et al, U.S. Pat. No. 4,874,664, describe lateral shifting or rotation of the position of the substrate in relation to the vapor flux to create uniform film growth and film layers that have columns with different orientations in the different layers. In Hamaguchi et al, the entire substrate is rotated in between periods of exposure of the substrate to vapor flux, or the substrate is laterally shifted during exposure to vapor flux.

The angle of the incident vapor flux in the prior art tends to be in the range from near 0° to 70° where the angle is measured between the vapor arrival line and the substrate normal, which may be referred to as the polar angle. Where the polar angle is zero, the deposited film is a uniform layer, and does not generate the columnar microstructure. For stationary substrates, results have been published for polar angles reaching close to 90°. The angle of growth of the columns is related in a way poorly understood to the angle of incidence of the vapor flux, but is always observed to be smaller, as measured from the substrate normal, than the angle of incidence.

A paper of Azzam, "Chiral thin solid films", Appl. Phys. Lett. 61 (26) 28 Dec. 1992, has proposed rotation of the substrate while it is exposed to the oblique incident vapor flux to generate a helical microstructure having helicoidal bianisotropic properties. The proposed rotation of the substrate is about an axis perpendicular to the surface of the substrate, which is referred to in this patent document as rotation about the azimuth, or variation of the azimuthal angle. No particular polar angle is specified, though a figure shows an angle of less than 60°. The inventors have attempted to grow microfilm structures by rotation of the substrate in the presence of a vapor flux incident at a polar angle of about 60° and 70°. However, the resulting structure does not show well defined structures.

The paper of Assam is a theoretical paper and fails to provide directions on how to carry out the method in practice. In addition, the patent of Hamaguchi et al provides only one particular microstructure, with limited variation of the columnar growth.

SUMMARY OF THE INVENTION

This invention seeks to overcome some of the limitations of the prior art and provide a film forming system method and apparatus that allows for the growth of complex microstructures with predetermined patterns of growth. In addition, porosity and optical properties of the shadow sculpted thin film are enhanced by expanding the range of incidence angles of the vapor flux. Further, a method is provided for capping a porous columnar microstructure with a dense film.

Further, the inventors have found to their surprise that rotation of the substrate while it is exposed to an oblique incident vapor flux at polar angles greater than about 80° produces well defined microstructures.

Therefore, in accordance with one aspect of the invention, there is provided a method of sculpting vapor deposited thin films, the method comprising the steps of:

initially exposing a surface of a substrate to a vapor flux at an oblique incident angle to grow a columnar thin film; and subsequently, and while continuing to expose the surface to vapor flux, rotating the substrate about an axis parallel to the plane of the substrate.

In a further aspect of the invention, there includes the step of, while initially exposing the substrate to vapor flux, moving the substrate to alter the direction of growth of the columns, as for example by rotating the substrate about a normal to the surface of the substrate to create a helical film growth. The substrate may then be rotated about an axis parallel to the plane of the substrate to form a cap for the helical thin film growth. In a further aspect, a cap may be formed by exposing the substrate to a vapor flux in conditions of high diffusion length, such that a dense uniform mass is obtained, such as by heating the substrate to nearly the melting point of the material forming the vapor flux.

In a further aspect of the invention, tailored film growths may be obtained by (a) establishing, in a computer, a desired pattern of thin film growth; (b) while exposing a surface of a substrate to a vapor flux at an oblique incident angle, changing the orientation of the surface in relation to the angle of incidence of the vapor flux; (c) providing control signals to the computer indicative of thin film growth on the substrate; and (d) automatically controlling the rate of change of the orientation of the surface in response to the control signals to grow the thin film according to the desired pattern.

In a still further aspect of the invention, there is provided a method of sculpting vapor deposited thin films, the method comprising the steps of exposing a surface of a substrate to a vapor flux at an oblique incident angle; and, at the same time, rotating the substrate about a normal to the surface while maintaining the oblique angle at greater than 80°.

In a still further aspect of the invention, there is provided an apparatus for growing thin films on a substrate having a surface, the apparatus comprising a vacuum chamber; a vapor source; a first motor disposed in the vacuum chamber above the vapor source, and having a first rotational axis, the first motor having a shaft and means for mounting a substrate on the shaft such that the first rotational axis is normal to the surface of the substrate; a driver for the first motor; a deposition rate monitor having output signals indicative of thin film growth on a substrate exposed to vapor flux from the vapor source; and a controller responsive to the output signals for instructing the drivers to cause the first motor to rotate according to a desired pattern. According to a second aspect of the apparatus of the invention, there is also provided a second motor disposed in the vacuum chamber above the vapor source, and having a second rotational axis at about 90° to the first rotational axis. The first motor is mounted on the shaft of the second motor such that the second rotational axis is parallel to the surface of the substrate. A driver, which may be the same driver as for the first motor, is also provided for the second motor. The controller is also responsive to the output signals to cause the second motor to rotate according to a second desired pattern.

In a further aspect of the invention, a thin film microstructure is provided wherein vapor deposited material extends in distinct helical columns from a substrate. The columns may be capped, and may be supplied with electrodes to form a delay line or a variable wavelength optical filter.

In a still further aspect of the invention, the substrate may be provided with small mounds spaced sufficiently close together that growths are confined to grow on the mounds and not between them. In this way, the spacing of the helical growths can be determined in advance of deposition.

These and other aspects of the invention are described in the detailed description of the invention and claimed in the claims that follow.

BRIEF DESCRIPTION OF THE DRAWINGS

There will now be described preferred embodiments of the invention, with reference to the drawings, by way of illustration, in which like numerals denote like elements and in which.

DETAILED DESCRIPTION OF PREFERRED EMBODIMENTS

Figure 1:
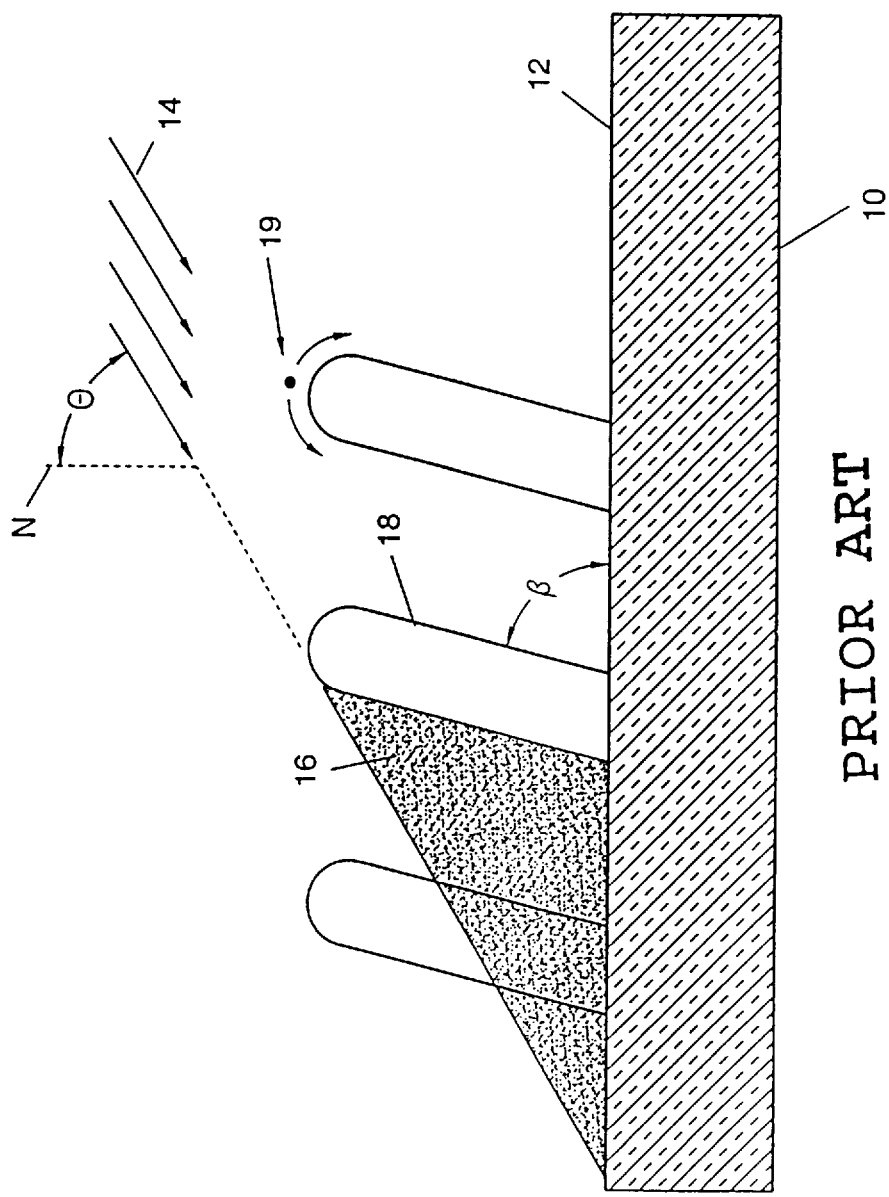
FIG. 1 is a schematic illustrating prior art understanding of how shadow sculpting forms columnar film microstructures.

FIG. 1 illustrates the physical process underlying growth of a slanted columnar film microstructure as is known in the prior art. A substrate 10, for example a silicon wafer, has a surface 12 with normal N and is exposed to an oblique incident vapor flux 14 whose angle of incidence, defined in relation to the normal N, is θ. As atoms in the vapor flux 14 are deposited onto the substrate 10, film growth areas atoms shadow adjacent regions 16, preventing deposition of vapor in these regions. Atoms in the vapor flux 14 continue to be deposited in regions that are not shadowed, thus forming columns 18. Atoms diffuse adatomically across the tops of the columns as shown at 19. Slanted columnar microstructures will grow if the angle θ is sufficiently large to create the shadowing effect, and there is limited adatom diffusion 19, such that adatom diffusion does not fill in the gaps between columns. In practice, angle θ need only be slightly above 0° to form reasonably defined columns and columnar structures will form in many substances at θ=0°, though they may be hard to discern under conditions such that the films have high atom diffusion lengths, for example due to high temperatures or materials with low melting points. The angle β of the axis of the columns 18 to the normal N of the substrate is less than θ. The actual relationship between θ and β is poorly understood, but approximations of the relationship are known in the art.

"Oblique" as used in this patent document in relation to an angle means sufficiently departing from 0° that atomic shadowing has an effect on the growth of columnar microstructures. The substrate may be any solid material on which a vapor may be deposited, and will depend on the application. Silicon substrates will be commonly used. The material to be deposited may be any material for which conditions are achievable to support vapor generation and deposition of the vaporized material on the substrate. In some cases, this may require cooling or heating of the substrate. To assist in bonding one vaporized material to another, an intervening layer may be first deposited, as for example using a chromium intermediate layer to bond gold to amorphous silicon dioxide (glass). The processes described here should be carried out in conditions in which the vapor flux arrives at the substrate in approximately a straight line. For this reason, it is preferred that the process be carried out under conditions approximating a vacuum, at less than $10^{-3}$ torr, for example at $10^{-6}$ torr. At higher pressures, scattering from gas molecules tends to prevent well defined structures from growing. In addition, the material used should have a sticking co-efficient of at least about 0.9 to enable the formation of distinct structures.

Figure 2:
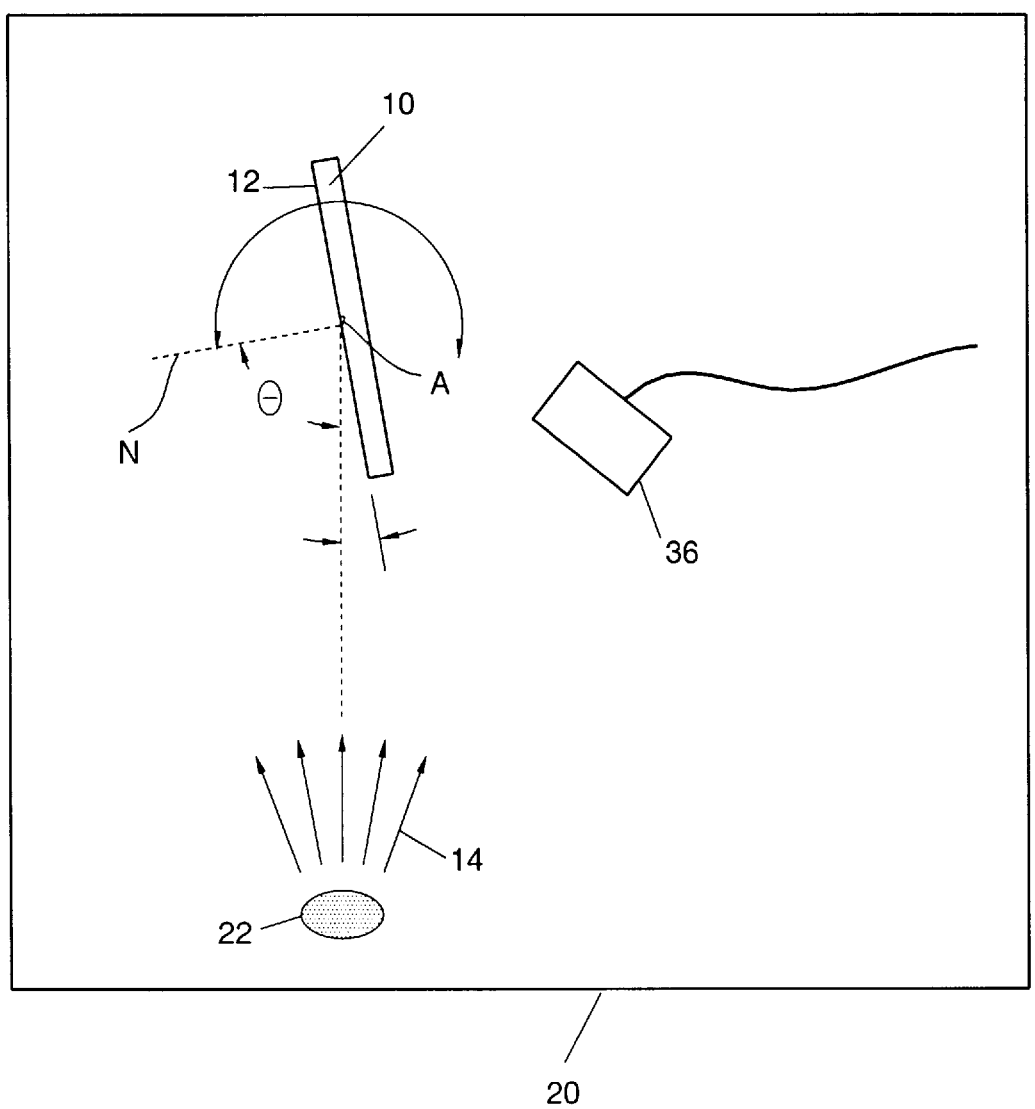
FIG. 2 is a schematic showing apparatus according to one aspect of the invention for depositing a thin film on a substrate using a vapor flux, with an exemplary substrate shown in side view, thereby illustrating how polar angle variation alters the incidence of the vapor flux.
Figure 3:
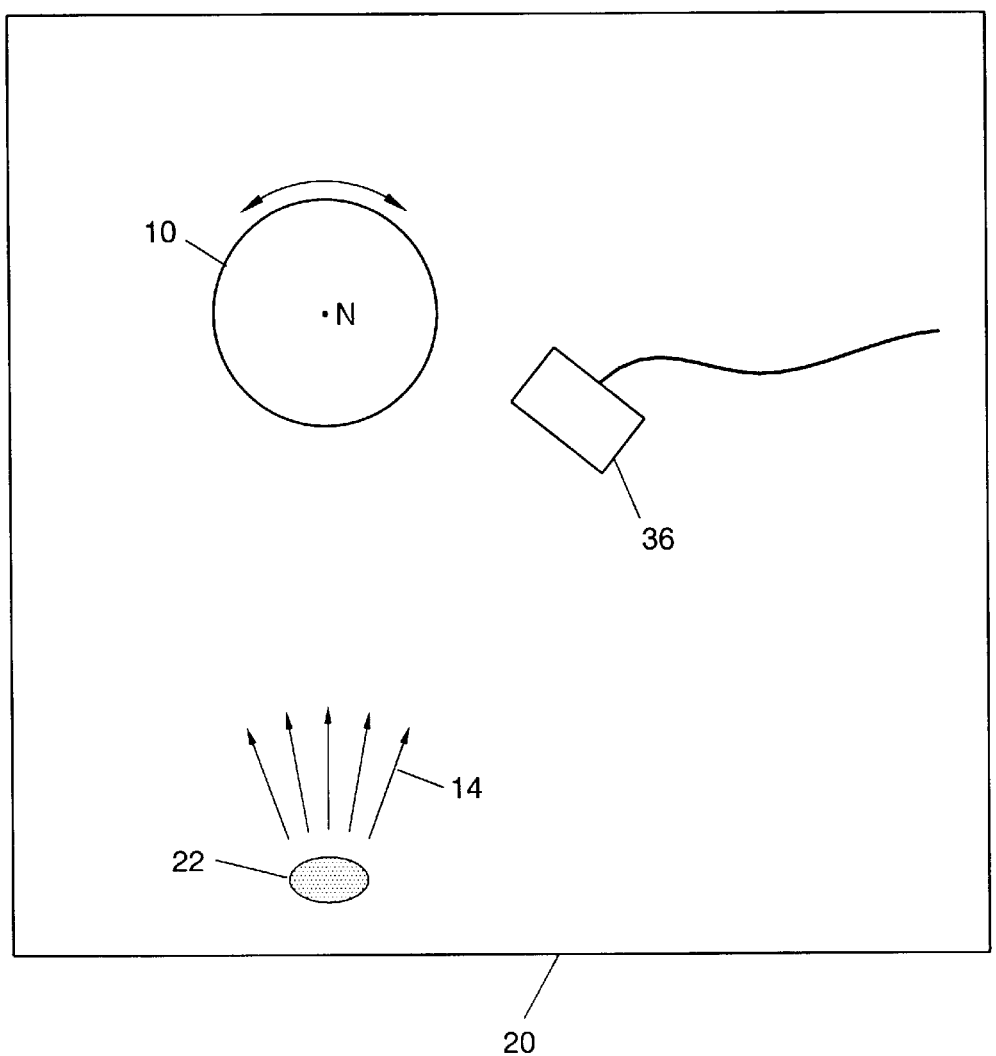
FIG. 3 shows the apparatus of FIG. 2 with the substrate in plan view, thereby illustrating rotation of the substrate about a normal to the plane of the substrate.
Figure 4:
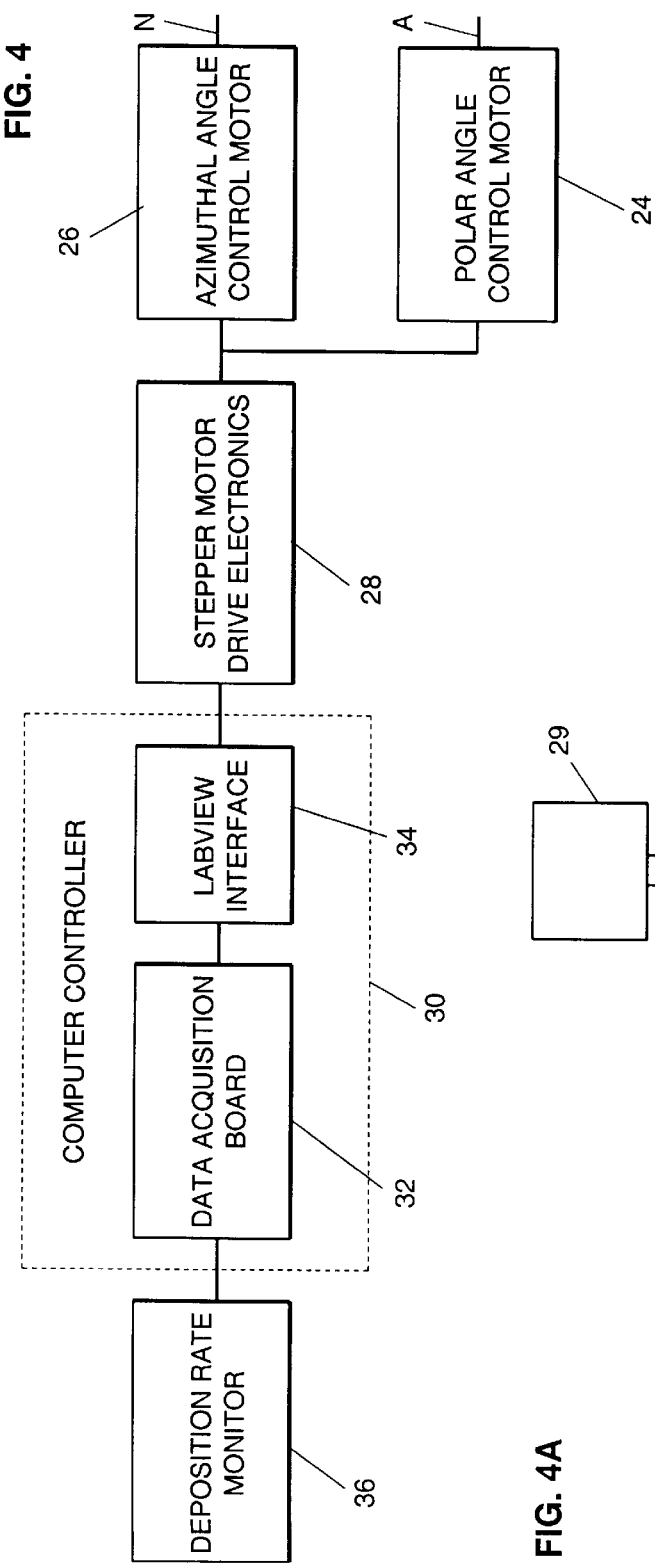
FIG. 4 shows control elements for use with the apparatus of FIGS. 2 and 3.

Referring now to FIGS. 2, 3 and 4, an apparatus according to the invention is shown for growing a thin film on a substrate 10 having a surface 12. A conventional vapor source 22 is located within a vacuum chamber 20. A conventional shutter (not shown) located above the vapor source 22 is used to control whether or not the substrate 10 is exposed to vapor. Various conventional means (not shown separately) for causing the vapor source 22 to emit a vapor flux 14 may be used. A substrate 10 is supported in the vacuum chamber 20 on a motor 24 (FIG. 4) disposed in the vacuum chamber 20 above the vapor source 22. The motor 24 rotates the substrate about an axis A lying parallel to and preferably in the plane defined by the surface 12 of the substrate 10. Rotation of the substrate 10 about axis A alters the polar angle, namely the angle of incidence θ of the vapor flux 14. Motor 26, also disposed in the vacuum chamber 20 above the vapor source 22, has a rotational axis coinciding with the normal N of the substrate 10 and thus alters the azimuthal angle. The polar angle and the azimuthal angles are both measures of the orientation of the surface of the substrate to the incident flux.

Figure 4A:
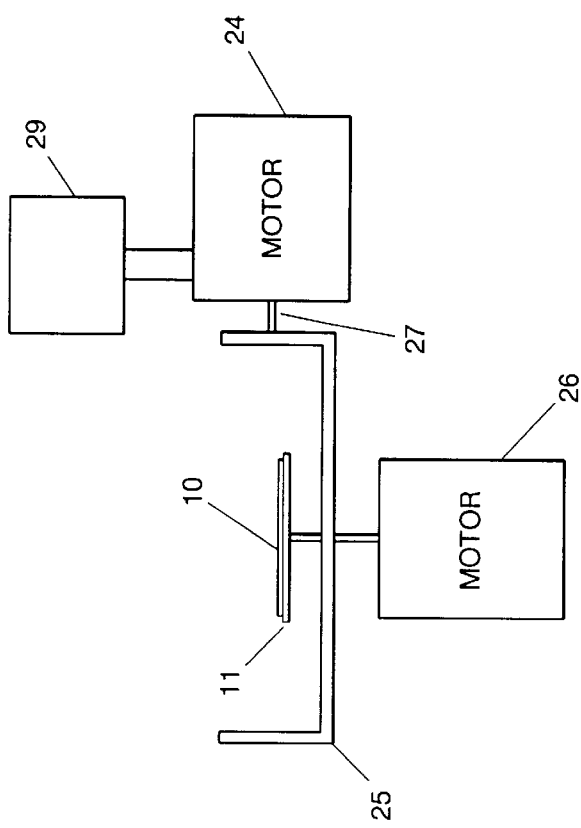
FIG. 4A shows an arrangement of the azimuthal and polar angle control motors.

As shown in FIG. 4A, the substrate 10 is preferably mounted on a disc 11 which is attached to motor 26. Various mounting arrangements of motor 24 and motor 26 may be used. For example, motor 26 may be mounted on a frame 25, and the frame 25 may be mounted to rotate with the drive shaft 27 of motor 24. Motor 24 itself may be mounted by any of various conventional methods for mounting motors within a vacuum chamber such as on a support 29.

Referring now to FIG. 4, motors 24 and 26 are preferably conventional stepper motors driven by stepper motor drive electronics 28 and controlled by computer controller 30. The computer controller 30 includes a data acquisition board 32 and a software based interface 34 such as LabVIEW™ available from National Instruments. The data acquisition board 32 receives signals indicative of thin film growth on the substrate output from a deposition rate monitor 36 of conventional construction located within the vacuum chamber 20 in a location in which film growth on the deposition rate monitor 36 is representative of film growth on the substrate 10. In response to receiving the output signals from the deposition rate monitor 36, the computer controller 30 instructs the driver 28 to cause the motors 24 and 26 to rotate according to a desired pattern. As described herein, the computer automatically controls the rate of change of the orientation of the surface in response to the output control signals to grow the thin film according to the desired pattern. An exemplary software program for programming the computer controller 30 using LabVIEW™ software is contained in the microfiche appendix. Start and stop signals for vapor deposition may be sent by the computer to a drive for the shutter for starting vapor deposition, or the shutter may be opened manually. Normally, the motors are started before the shutter opens to initiate deposition.

The software receives a deposition rate from the deposition rate monitor. The actual thickness (T2) of the film growing on the substrate is related to the thickness on the deposition rate monitor by an empirically determined scaling factor known as the tooling factor. The software also knows the motor positions at the last time instant (Xfi for motor 24, Xci for motor 26) and receives as input from the operator, the number (N) of turns to be made by the motor 26, the tooling factor (ratio of vertical film growth rate to measured deposition rate), an initial deposition rate estimate, an initial angle of incidence for the vapor flux during sculpted film growth, motor rotation direction, and various parameters that define the desired pattern of growth for the film. The inputs to the computer establish the desired pattern of film growth.

In the case of formation of helical film growths, the pitch w of the helix must be specified, and in the case of a capping layer for a film growth, both the cap thickness (Tc) and number of turns (Nc) of the motor 24 must be specified by the operator.

In an embodiment of the invention, the motors 24, 26 are step motors that rotate a fraction of a circle each time instant, ti, ti+1, ti+2 etc. At any given time ti, the computer has just updated the thickness of the film from the deposition rate monitor 36 and changed the motor step rate so that at ti+1, the motor 24, 26 will be at approximately the desired position according to the desired pattern. Between time instants ti and ti+1, the software calculates what the thickness of the film growth will be at ti+2 and calculates how fast the motors must rotate in order to give the desired thickness at ti+2. At ti+2, the computer then reads the new thickness from the deposition rate monitor as well as the motor stepping rates, and adjusts the motor stepping rate so that at ti+3 the film growth pattern will be approximately as desired. The software continues in this fashion until a stop signal is received, for example when the film has reached a desired thickness.

Algorithms for controlling the motors 24, 26 in the case of a helical film with a cap are incorporated in the microfiche appendix, and illustrated graphically in FIGS. 5A–5D. For the motor 26, if helical film growth has not reached the desired thickness, that is, T2 is less than w*N, where * indicates multiplication throughout this patent document, then Xc2 is 360°/w*T2, that is, the substrate 10 is rotated to a position equal to 360° times the ratio of T2 to w. If T2 is greater than or equal to w*N, that is, the helical film thickness has been achieved, then during a capping process, Xc2 is 360*N+360*Nc/Tc*(T2−w*N), that is, Xc2 gradually increases from 360*N to 360*(N+Nc) proportionally to the capping layer thickness (T2−w*N). This rotation rate will typically be faster than the rotation rate during helical film growth, depending on the choice of the factor Nc/Tc.

For the motor 24, if helical film growth has not reached the desired thickness, the motor 24 does not change position, hence polar or flux angle remains the same. If T2 is greater than or equal to w*N, then the new motor position Xf2 equals the motor position at the last time instant (Xfi) plus (90−Xfi) times the ratio of the difference of T2 from w*N to the thickness of the cap (that is, Xfi=Xfi+(90−Xfi)/Tc*(T2−w*N).

Figure 5A:
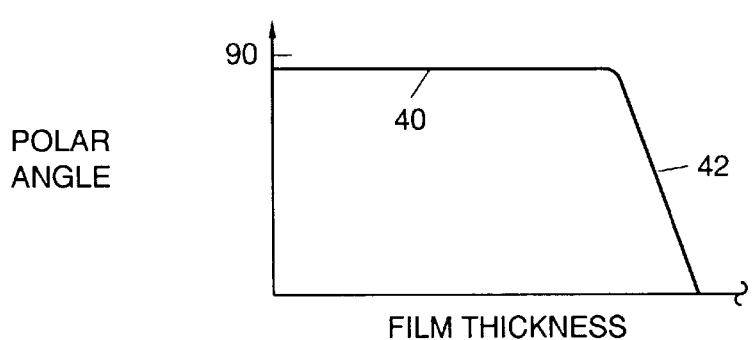
FIGS. 5A, 5B, 5C and 5D are graphs illustrating polar (FIGS. 5A, 5B and 5C) and azimuthal (FIG. 5D) angle variations.

This last formula is represented graphically in FIG. 5A. The polar angle (angle of incidence measured from the normal) is kept constant over an initial period 40, during which the surface of the substrate is exposed to oblique incident vapor flux, and then rotated at a constant angular rate to zero, while continuing to expose the surface to vapor flux. Changing of the polar angle towards zero produces a cap for the sculpted film growths. At zero polar angle, the flux is normally incident. The algorithm for controlling the azimuthal angle results in the substrate rotating N times to achieve a helical film growth of thickness T2=w*N. During the capping process, the substrate continues to rotate about the azimuth, typically, but not necessarily, at a faster rate than during helical film growth. During the period 40, the substrate 10 may be (a) rotated about a normal to its surface to create helical microstructures, (b) shifted 180° to form zig-zags, (c) translated, (d) kept at a constant orientation to the vapor source, or (e) otherwise rotated or translated to obtain a desired growth pattern under the cap.

Figure 5B:
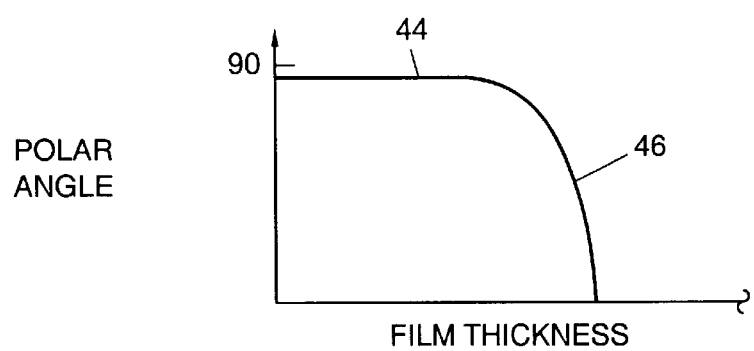

Alternatively, the cap for a film growth may be created by exponentially decreasing polar angle as illustrated in FIG. 5B. The algorithm for controlling the polar angle is the same during helical film growth as for the linear cap: the angle is the kept constant. During capping, Xf2 is assigned the value Xfi plus (90−Xfi) times e raised to the power of ((T2−w*N−Tc)/k), where k is the exponential scale factor or time constant (for example, 800). Hence, the polar angle drops monotonically from near 90° to zero as T2 approaches the sum of w*N (the desired thickness of the columnar layer) and Tc (the thickness of the cap). As illustrated in FIG. 5B, polar angle is constant during helical film growth (area 44) and exponentially decreasing to zero in area 46. Rotation speed of the substrate about its normal depends in part on the deposition rate. For $MgF_2$ at 85° angle of incidence, and a pitch of about 50 nm, the speed is about 2 rpm. Typical rotation speeds used in the process are about 0.2 to 3 rpm. For higher deposition rates, higher speeds will be possible, but the speed should not be so high so as to destroy the distinct columnar features produced by the invention.

Figure 7A:
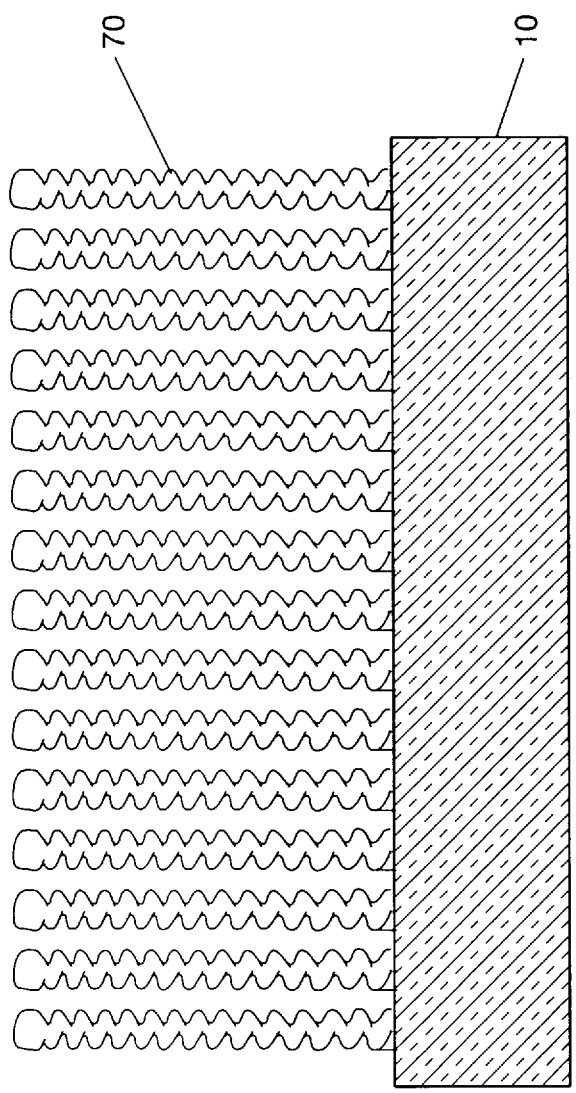
FIG. 7A is a side view of a thin film with helical growths deposited on a substrate.
Figure 7B:
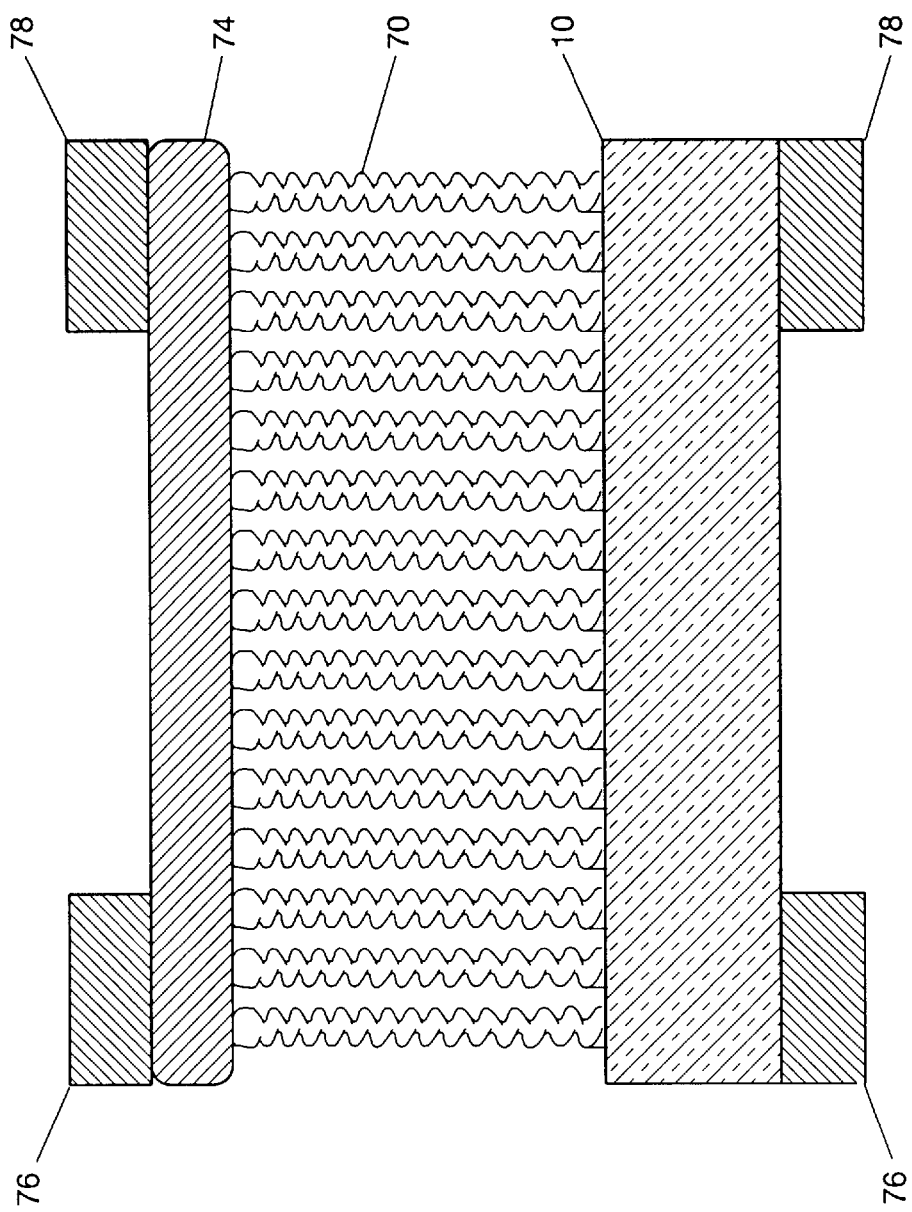
FIG. 7B is a side view of a thin film as in FIG. 7A with a cap, showing electrodes schematically (the electrodes are not necessarily to scale, since in practice each electrode could cover thousands of helixes)

FIG. 7A illustrates a thin film microstructure produced by the process described here with rotation of the substrate about a normal to the substrate. Vapor deposited material extends in distinct (separate from one another) helical columns 70 from the substrate 10. FIG. 7B illustrates the same thin film with the distinct helical columns 70 terminating distally from the substrate 10 in a region of denser material forming a cap 74 for the helical columns. The cap 74 may be produced by changing the angle of incidence of the flux from θ near 90° to zero (as in FIG. 2) as described above (corresponding to rotation about an axis parallel to the substrate surface), or, it is believed on reasonable grounds that, the deposition of the helical columns may be ended under conditions giving rise to a higher diffusion length, as for example higher substrate temperature or changing to a lower melting point material. Increased substrate temperature may be created by exposing the substrate to light from quartz lamps. Temperatures of within about 100° C. to 200° C. of the melting point of the material being deposited may be required to create conditions of high diffusion length.

In these cases, the substrate 10 is planar. If the substrate 10 is not planar, a mask may be used to expose the substrate 10 to vapor only through slits in the mask and thus control the angle of incidence of the vapor. The mask may then be moved across the substrate to produce the desired thin film by sequential exposure of different portions of the substrate.

Figure 5C:
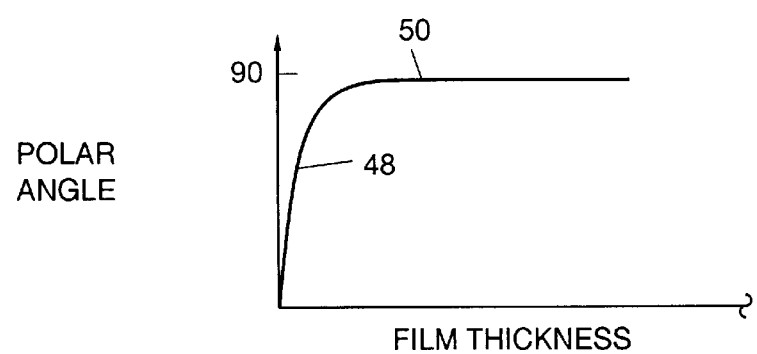
Figure 5D:
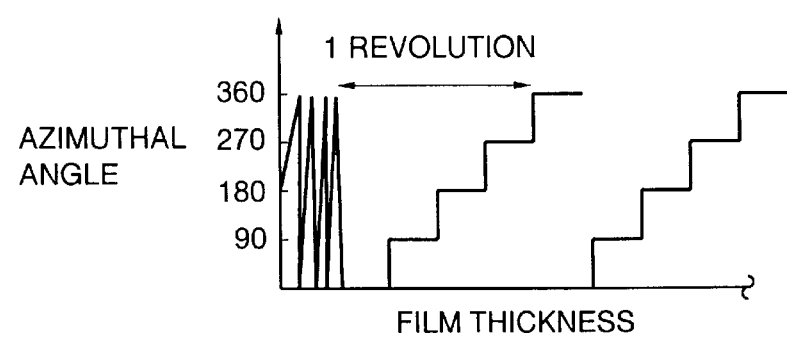

The desired pattern of film growth may also be tailored further. For example, a film may be started with a planar film of low porosity by rotating the substrate through exponentially increasing polar angles (zero to near 90°, as seen in FIG. 5C, area 48), with rapid azimuthal rotation (FIG. 5D), and then columns may be grown on the substrate 10, with or without rotation. In one embodiment of a tailored growth pattern, the substrate 10 is maintained at a constant polar angle (area 50 in FIG. 5C) while the substrate is repeatedly (a) rotated azimuthally a set number of degrees, for example 90°, and (b) held at a constant azimuthal position while the film grows obliquely, but linearly. The result is a helix with square sides in this instance. In general, the number of sides of the helix is 360/γ, where γ is the number of degrees the substrate is rotated during periods of deposition.

In a further variation, the rotation of the motor 26 may be reversed during deposition to produce helices with sections of different handedness, one section having a right handed twist, and the other a left handed twist.

Since the deposition rate tends to vary considerably during deposition, to achieve helical growths with constant pitch, the rotation speed may need to be increased and/or decreased during deposition. In addition, by increasing/decreasing rotation relative to the deposition rate, helices with reduced/increased pitch, or helices with graded pitch may be obtained.

In general, the polar angle during an initial deposition period in which helical microstructures are to be produced should be greater than about 80°. The following table shows density of substances deposited as an obliquely incident vapor flux onto a substrate rotating about a normal to the surface of the substrate. The density given is the measured density of the helical film as a percent of the density of a planar film deposited at zero polar angle (normal incidence).

TABLE 1

| Substance | Polar Angle in Degrees | % Density |
|---|---|---|
| Cu | 85 | 46 |
| Cu | 88 | 37 |
| MgF$_2$ | 85 | 32 |
| CaF$_2$ | 75 | 19 |
| CaF$_2$ | 85 | 9.3 |
| SiO | 85 | 32 |
| SiO | 88 | 22 |
| SiO | 85 | 42 |
| SiO | 75 | 89 |
| Al | 85 | 32 |
| Mn | 85 | 52 |
| Cr | 85 | 27 |
| Ag | 85 | 52 |

While the porosity of CaF$_2$ at a polar angle of 75° is high, CaF$_2$ exhibits apparently poor structural features at 75°. The high porosity is believed to be due to the fact that CaF$_2$ molecules have extremely low surface mobility and thus, when molecules of CaF$_2$ collide with already deposited material, the molecules do not move far and they form very fine microstructures. By contrast, SiO at about 70° polar angle produces a layered structure without well defined helices.

Figure 6:
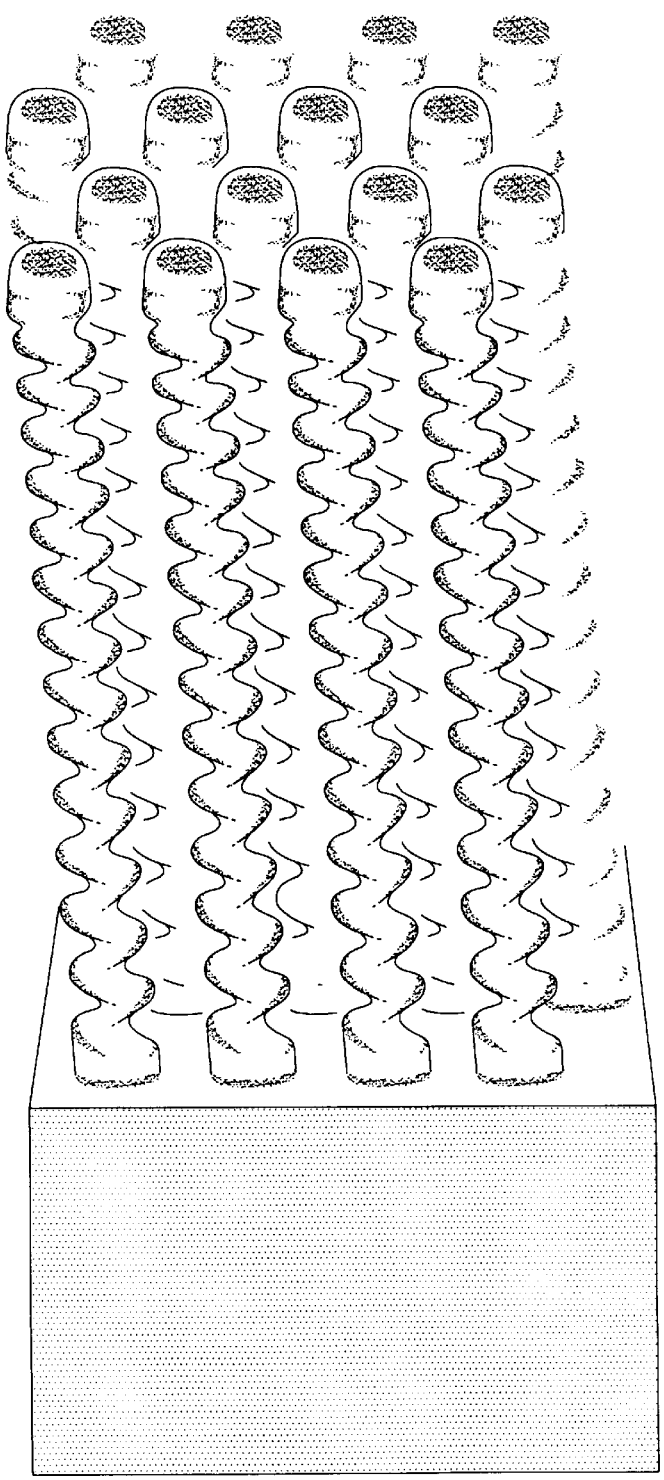
FIG. 6 is a scanning electron micrograph showing helical columns of $MgF_2$.

FIG. 6 is a micrograph of helical growths of MgF$_2$ on a glass substrate. Source material was evaporated by resistively heating a filled tantalum foil boat in a vacuum chamber with pressure 1×10$^{-6}$ torr. The polar angle was 85°. The growth shown here used feedback from the deposition rate monitor to ensure a film growth with constant pitch (w). Helices of similar form have been grown with pitches ranging from 50 to 2,000 nm, and in films composed of MgF$_2$, SiO, CaF$_2$, Cr, Mn, Ag and Cu. It is believed on reasonable grounds that the process will work with any column forming depositable material. Depositable material is column forming when it exhibits limited adatom diffusion and a sufficiently high sticking factor that structures are formed, rather than unformed masses. Tests show that the MgF$_2$ helical film growths thus produced exhibit optical rotatory dispersion when $\lambda_{vac} > n_{avg} w$, where $\lambda_{vac}$ is the wavelength of light in a vacuum and navg is the index of refraction of the MgF$_2$ film. The MgF$_2$ film has been found to exhibit optical rotation approximating 340 degrees/mm in a film with 17.3 turns and w=360 nm. Optical rotation for MgF$_2$ is counterclockwise for a right-handed helix, and clockwise for a left-handed helix.

Figure 8:
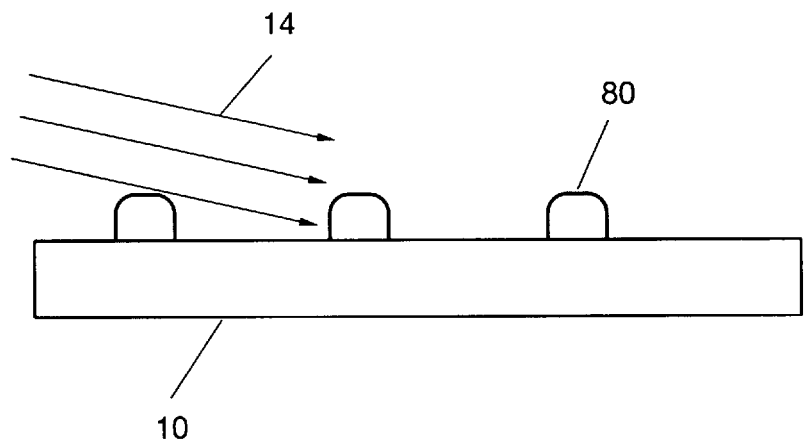
FIG. 8 is a side view of a substrate with mounds for pre-determining the location of helical growths.
Figure 9:
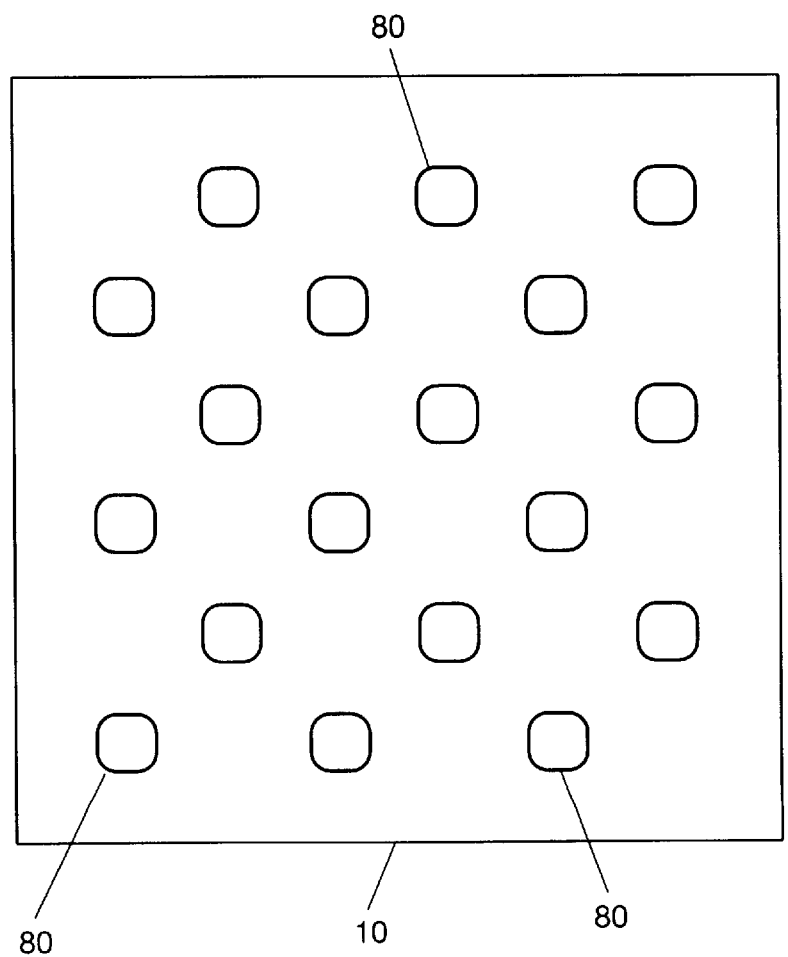
FIG. 9 is a plan view of a substrate with mounds showing one particular pattern of mounds.

As shown in FIG. 8, small mounds 80 may be micromachined or otherwise formed on the substrate 10 to form preferred locations for helical growths to initiate growth. The mounds 80 should be sufficiently close that shadowing effects prevent deposition of vapor between the mounds. In the case of mounds 80 having a height in the order of 1 micron, the mounds 80 should not be more than a few microns apart in case of the angle of incidence of the vapor being greater than 80°. The desired separation of the mounds 80 depends on the height of the mounds, the angle of incidence of the vapor, and the diffusion length of the vapor. An approximation of the separation L is given by L=htanθ where h is the height of the mounds. The mounds may have any shape, but the diameter is preferably selected so that only one column grows on each mound. The mounds 80 restrict growth of helixes to the mounds 80, and thus the growths can be forced to grow in specific locations. Various patterns of mounds for growing helical collumns can be made such as one shown in FIG. 9. The mounds can be used to grow slanted columns (no rotation of the substrate), and can be used to grow helices (with rotation of the sustrate. Control of the separation of the columnar growths is believed to be useful in applications such as operation of the thin film microstructure as a delay line, where the acoustic wave characteristics depend on the spacing of the helical columns, or use of the thin film microstructure as a biological filter.

Figure 7C:
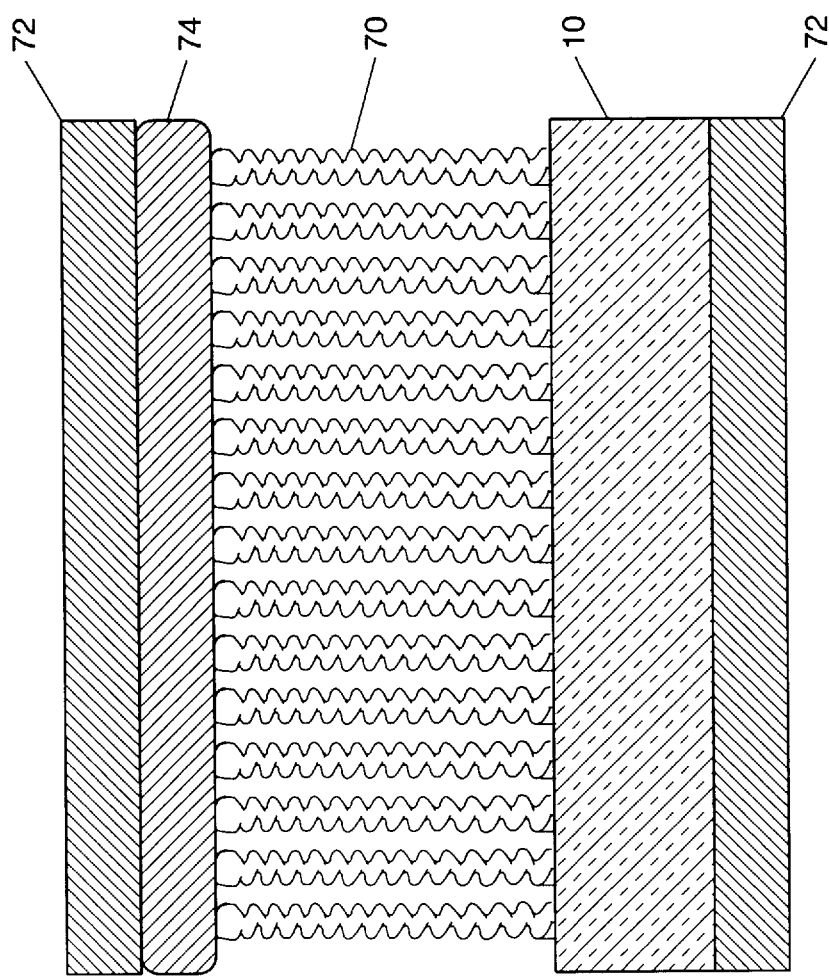
FIG. 7C is a side view of the thin film of FIG. 7B with electrode plates bounding the structure.

Applications for the sculpted thin film helical growths described here include uses as helicoidal bianisotropic media, which are useful in a wide range of applications, as for example as isolators, circular polarizers, quarter-wave and half-wave plates, frequency converters and notch filters. When used as helicoidal bianositropic media, the vapor deposited material should be at least partially transparent at the wavelength of the electromagnetic radiation of interest. The helical growths 70, illustrated in FIG. 7A, deposited on a substrate 10, and grown with rotation of the substrate about a normal to the surface of the substrate, (with or without capping) may be sandwiched between two transparent charged electrodes 72 as shown in FIG. 7C. The electrodes 72 are shown schematically and in practice may be thicker. The electrodes 72 may be made from indium tin oxide or other transparent electrically conducting material and preferably take the form of plates. The cap 74 is preferably made from the same material as the helical growths, but need not be. When used with bounding electrodes such as those shown in FIG. 7C, the cap 74 and substrate 10 act as insulators. If insulators are not required in an application, then the substrate 10 may be conducting and the cap may form the upper electrode. The structure shown in FIG. 7C may be used as an optical filter for circularly polarized light. By appying a charge to the electrodes 72, the electrodes 72 may be pulled together or pushed apart and thus change the pitch of the helices 70. This has the effect of tuning the filter created by the thin film.

In a further application, particularly of the helical growths 70 as illustrated in FIG. 7B with a cap 74, pairs of electrodes 76 and 78 may be placed at opposed ends of the structure spaced from each other. A varying voltage may be applied to one electrode 76 to sequentially compress and expand the structure, with the helical columns thus functioning as microscopic springs, in a direction parallel to the helices 70 in accordance with the varying voltage. The series of compressions and expansions will then propagate along the structure as an acoustic wave to the other end where the electrodes 78, acting as a capacitative acoustic wave sensor, convert the acoustic wave to an electrical signal. Such a device may act for example as an electronic delay line, with a long delay in a very short structure.

Other applications for the thin films described here include use as electroluminescent devices wherein the substrate is formed of a metal, and the columnar growths are oxidized and crystallized to generate an array of quantum wires.

The quantum wire array may be ion-etched to remove the topmost oxide and overcoated with a transparent conductor under conditions that lead to a dense film. The lid would also provide electrical continuity to all wires. Polarizing, retarding, and/or optical interference coatings can be deposited over the transparent conductor in order to tailor the wavelength, the polarization, and the intensity of the emitted light.

Sculpted thin films can also be designed consisting of a highly porous thick retarder film on top of a transparent substrate. An optical sensing system may use a linearly polarized laser beam to illuminate the film so as to yield a half-wave phase-shift at the appropriate laser wavelength. Adsorption of a chemical or biological species on the pore surfaces gives rise to small but detectable changes in the birefringence. This, in turn, generates a non-zero detector signal when viewed through a polarizer parallel to the incident laser beam.

A more advanced method uses a similar optical configuration but with coil elements (helical columns). In this case, the combination of birefringence and optical rotation will give a complex spatial irradiance pattern at the detector which can be detected with a two-dimensional array. The changes in this pattern may provide a recognizable optical signature of the adsorbed species. Through the use of pattern recognition techniques, a single sculpted thin film may thus be able to distinguish a wider range of chemical species than existing devices. Such chemical sensors will combine the high sensitivity of a large surface-to-volume ratio with optical phase detection. They operate on the principle that the interface dipoles associated with an effective fractional monolayer's coverage are sufficient to generate a detectable change in the birefringence and optical rotation of the films (which can be modeled with the use of known effective medium theories).

In addition, because the sculpted thin films are porous they can be impregnated with molecular monolayers or discrete clusters designed to react with specific chemical species. Alternatively, they can act as catalyst supports such that catalytic reactions take place and are sensed when a properly dispersed catalyst is exposed to gases.

Sculpted thin films as made in accordance with the invention may also be used as micro-sieves. Columnar sculpted thin films are highly porous, the backbone elements taking up about 10–30% of space. After a STF has been made, it may be dipped in a chemical bath to conformally coat the backbone elements with selected chemicals. When a biological fluid is forced through the micro-sieve thus made, particles in the fluid interact with the chemicals over large surface areas and are filtered out. This is believed to be particularly effective for particles of linear dimensions 10–50 mm. As described earlier, the backbone elements can be cleverly designed to fit the particle shapes, much as a key fits a lock.

In a different approach for realizing micro-sieves, the void regions of a columnar thin film may be filled with some material (e.g. a polymer) and the initial material then removed, leaving the replamineform with 70–90% space filled and embedded sculpted thin film void nanostructure. The resulting nanostructure would be smaller in volume (10–30%) as well as in size (30–100 nm). With this extension to the manufacture of sculpted thin films, the matrix as well as the void phases can be varied continuously from 10% to 90% while still retaining large internal surface area.

Thus, a sculpted thin film micro-sieve may serve as a trap or filter for viruses quite effectively. Another use of a micro-sieve may be to provide a biocompatible substrate for tissue to grow on. Two bone fragments can possibly be joined by placing a sculpted thin film in between them and letting tissue grow through the thin film. Likewise, tissue can be made to grow on a biocompatible sculpted thin film attached to a prosthetic device. The replamineform approach based upon natural structures, such as corals, is currently used commercially for biomedical applications.

Other uses for thin films with helical growths include applications in semiconductor integrated circuit fabrication such as very low dielectric insulators for high speed devices, thermal barrier coatings on high temperature cycling parts such as jet turbine blades, flat panel displays, thermoelectric cooling panels, solar absorbers, adhesive surfaces, electron emitters, tactile sensing for smart skins, magnetic devices, anti-reflection/low dielectric constant coatings, humidity sensing and microfluid pumping systems.

The technique of changing the polar angle after columnar deposition may be used to cap films with slanted, curved, vertical or other variably shaped columns.

A cap for a porous microstructure may also be formed by exposing the porous microstructure to conditions in which the atoms in the vapor flux have a higher diffusion length than during formation of the porous microstructure, as by changing the substrate temperature or changing to a lower melting point material in the vapor flux. It will be understood that in performing the inventive steps described herein the film composition may be altered during deposition by changing the material in the vapour flux. This may occur during formation of a porous microstructure, immediately before capping, or even during capping to form a layer, composite structure.

A person skilled in the art could make immaterial modifications to the invention described in this patent document without departing from the essence of the invention that is intended to be covered by the scope of the claims that follow.

The embodiments of the invention in which an exclusive property or privilege is claimed are defined as follows:

1. A method of sculpting vapor deposited thin films, the method comprising the steps of:
   initially exposing a surface of a substrate to a vapor flux of material at an oblique incident angle to grow a columnar thin film formed of columns of the material; and
   subsequently, and while continuing to expose the surface to the vapor flux, rotating the substrate about an axis parallel to the plane of the substrate.

2. The method of claim 1 further comprising, while initially exposing the substrate to the vapor flux, moving the substrate to alter the direction of growth of the columns.

3. The method of claim 2 in which moving the substrate to alter the direction of growth includes rotating the substrate about a normal to the surface of the substrate.

4. The method of claim 3 in which:
   the substrate is rotated about a normal to the surface to establish a helical thin film growth, during a first depositional period of time without rotation about the axis parallel to the plane of the substrate; and
   the substrate is rotated during a second depositional period of time about the axis parallel to the plane of the substrate to form a cap for the helical thin film growth.

5. The method of claim 4 in which the substrate is rotated about the normal axis during the second depositional period.

6. The method of claim 4 in which the angle of the substrate to the vapor flux is maintained constant during the first depositional period at an angle greater than 80°.

7. A method of sculpting vapor deposited thin films, the method comprising the steps of
   establishing, in a computer, a desired pattern of thin film growth;
   while exposing a surface of a substrate to a vapor flux at an oblique incident angle, rotating the substrate about a normal to the surface;
   providing control signals to the computer indicative of thin film growth on the substrate; and
   automatically controlling the rotation speed of the substrate in response to the control signals to form distinct helical columns of material on the substrate.

8. The method of claim 7 further comprising forming a cap on the distinct helical columns by depositing material, after formation of the distinct helical columns, under conditions such that gaps between the distinct helical columns are filled in.

9. The method of claim 8 in which the gaps between the distinct helical columns are filled in by heating the surface of the substrate during deposition of the vapor flux.

10. The method of claim 7 further comprising:
    rotating the substrate about an axis parallel to the plane of the substrate to form a cap on the distinct helical columns.

11. A method of sculpting vapor deposited thin films, the method comprising the steps of:
    exposing a surface of a substrate to a vapor flux at an oblique incident angle; and, at the same time,
    rotating the substrate about a normal to the surface while maintaining the oblique angle at greater than 80° to a normal to the surface of the substrate, so as to form distinct helical columns of material on the substrate.

12. The method of claim 11 further including forming a cap on the distinct helical columns.

13. The method of claim 12 in which forming a cap comprises rotating the substrate about an axis parallel to the surface of the substrate while exposing the substrate to the vapor flux.

14. The method of claim 12 in which forming a cap comprises exposing the substrate to vapor flux under conditions such that gaps between the distinct helical columns are filled in.

15. The method of claim 14 in which the gaps between the distinct helical columns are filled in by heating the substrate during deposition of the vapor flux.

16. A method of growing thin film microstructures on a substrate exposed to a vapor flux at an oblique angle of incidence, the method comprising the steps of:
    forming mounds on the substrate, the mounds being separated by sufficient distance that vapor is not deposited between the mounds; and
    exposing the surface of the substrate to a vapor flux at an oblique incident angle to grow a columnar thin film on the mounds, with one column on each mound.

17. The method of claim 16 further including:
    rotating the substrate about a normal to the substrate during deposition to create helical growths.

* * * * *